(12) United States Patent
Morales et al.

(10) Patent No.: US 8,996,323 B1
(45) Date of Patent: Mar. 31, 2015

(54) SYSTEM AND METHOD FOR ASSESSING POWER DISTRIBUTION SYSTEMS

(75) Inventors: Osvaldo P. Morales, Seattle, WA (US); Michael P. Czamara, Seattle, WA (US)

(73) Assignee: Amazon Technologies, Inc., Reno, NV (US)

( * ) Notice: Subject to any disclaimer, the term of this patent is extended or adjusted under 35 U.S.C. 154(b) by 297 days.

(21) Appl. No.: 13/173,102

(22) Filed: Jun. 30, 2011

(51) Int. Cl.
*G01R 31/00* (2006.01)
*G01R 31/08* (2006.01)

(52) U.S. Cl.
CPC .................................. *G01R 31/086* (2013.01)
USPC .............................................. 702/58; 324/527

(58) Field of Classification Search
CPC .... G01R 31/026; G01R 31/08; G01R 31/086; Y04S 10/522
USPC .............................................. 702/57, 58, 81
See application file for complete search history.

(56) References Cited

U.S. PATENT DOCUMENTS

| | | | |
|---|---|---|---|
| 6,714,977 B1 | 3/2004 | Fowler et al. | |
| 6,782,833 B2 | 8/2004 | Nightall | |
| 8,321,163 B2 | 11/2012 | Ewing et al. | |
| 2008/0093927 A1 | 4/2008 | Ewing et al. | |
| 2010/0148791 A1* | 6/2010 | Oldenburg et al. | 324/523 |
| 2012/0068718 A1* | 3/2012 | Hochwald et al. | 324/532 |
| 2012/0233345 A1* | 9/2012 | Hannuksela | 709/231 |

OTHER PUBLICATIONS

Robert G. Eilis, Power System Harmonics A Reference Guide to Causes, Effects, and Corrective Measures, Allen Bradley, 2001.*
"Two-Channel Intercom Power Supply PS-232" Clear-Com Intercom Systems 2002, pp. 1-2.
Keith Brandt "When Bad Harmonics Happen to Good People" Downloaded May 13, 2011 from news.ospmag.com OSP Magazine published Nov. 2007 pp. 1-3.
U.S. Appl. No. 13/076,198, filed Mar. 30 2011, Osvaldo P Morales et al.

* cited by examiner

*Primary Examiner* — Mischita Henson
*Assistant Examiner* — Kyle R Quigley
(74) *Attorney, Agent, or Firm* — Robert C. Kowert; Meyertons, Hood, Kivlin, Kowert & Goetzel, P.C.

(57) ABSTRACT

A method of assessing an electrical power distribution system includes establishing a baseline signature for one or more points in the power distribution system and assessing the power distribution system using the baseline signatures. Establishing the baseline signatures includes injecting one or more input signals (for example, a tone) at one or more injection points in the power distribution system, sensing one or more output signals at one or more sensing points in the power distribution system, and establishing a baseline signature for one or more of the points based on one or more of the output signals.

30 Claims, 7 Drawing Sheets

SYSTEM AND METHOD FOR ASSESSING POWER DISTRIBUTION SYSTEMS

BACKGROUND

Organizations such as on-line retailers, Internet service providers, search providers, financial institutions, universities, and other computing-intensive organizations often conduct computer operations from large scale computing facilities. Such computing facilities house and accommodate a large amount of server, network, and computer equipment to process, store, and exchange data as needed to carry out an organization's operations. Typically, a computer room of a computing facility includes many server racks. Each server rack, in turn, includes many servers and associated computer equipment.

Because the computer room of a computing facility may contain a large number of servers, a large amount of electrical power may be required to operate the facility. In addition, the electrical power is distributed to a large number of locations spread throughout the computer room (e.g., many racks spaced from one another, and many servers in each rack). Usually, a facility receives a power feed at a relatively high voltage. This power feed is stepped down to a lower voltage (e.g., 110V). A network of cabling, bus bars, power connectors, and power distribution units, is used to deliver the power at the lower voltage to numerous specific components in the facility.

From time to time, elements in the power chain providing power to electrical systems fail or shut down. For example, if a power distribution unit that provides power to electrical systems is overloaded, an overload protection device in the power distribution unit (for example, a fuse or breaker) may trip, shutting down all of the electrical systems that are receiving power through that line of the power distribution unit.

In many cases, documentation is kept by service personnel showing the configuration of a power distribution system and its components. Ideally, the documentation precisely reflects all of the components that are in the system and how the components are connected. In practice, however, such documentation may be incomplete, inaccurate, or out-of-date due to oversights or errors by the personnel responsible for the documentation.

Figure 1:
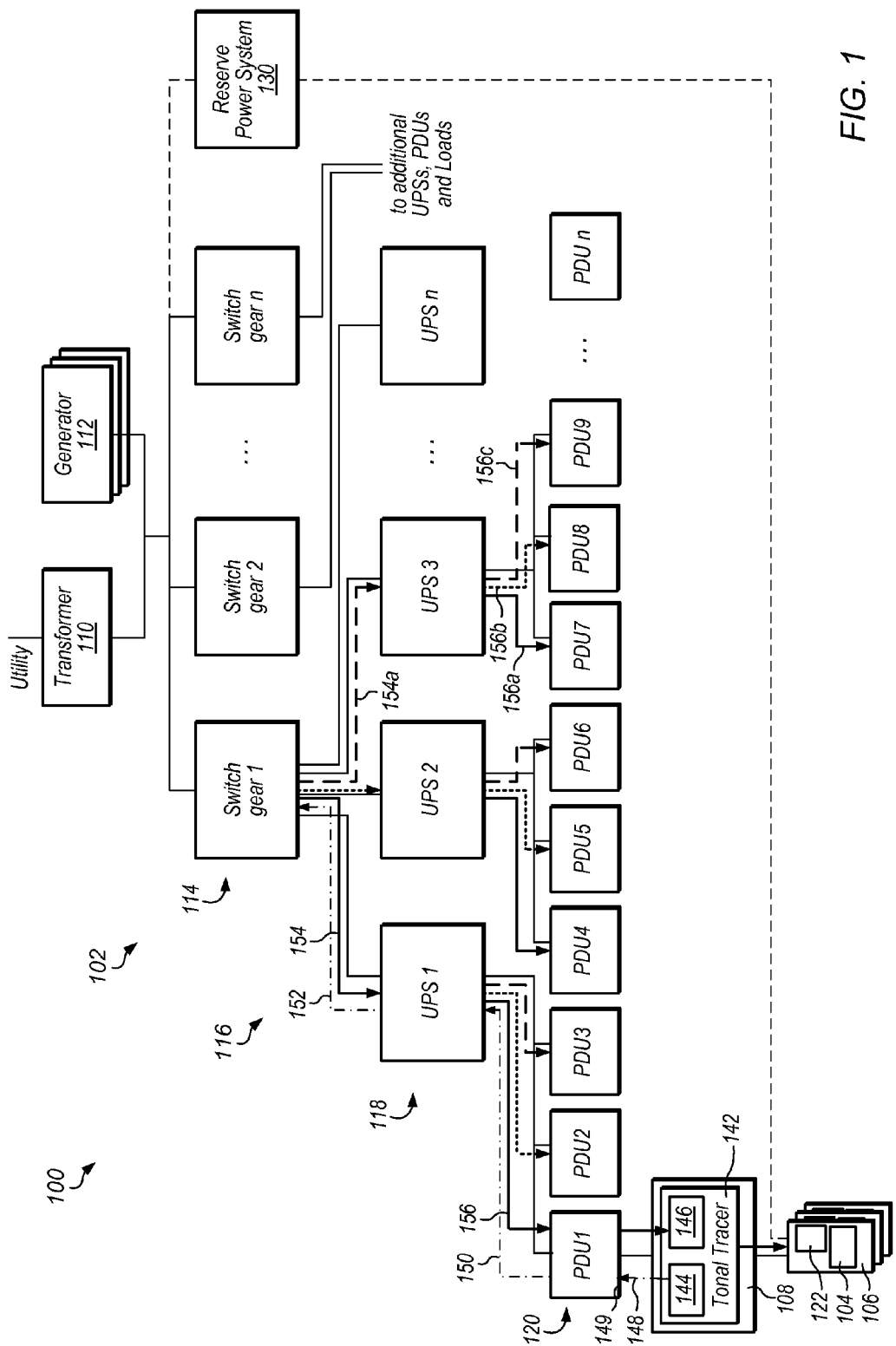
FIG. 1 is a block diagram illustrating one embodiment of a power distribution assessment device coupled to a power distribution system for electrical systems in a data center.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims. The headings used herein are for organizational purposes only and are not meant to be used to limit the scope of the description or the claims. As used throughout this application, the word "may" is used in a permissive sense (i.e., meaning having the potential to), rather than the mandatory sense (i.e., meaning must). Similarly, the words "include," "including," and "includes" mean including, but not limited to.

DETAILED DESCRIPTION OF EMBODIMENTS

Various embodiments of systems and methods for assessing an electrical power distribution system are disclosed. According to one embodiment, a method of assessing an electrical power distribution system includes establishing a baseline signature for one or more points in the power distribution system and assessing the power distribution system using the baseline signatures. Establishing the baseline signatures includes injecting one or more input signals (for example, a tone) at one or more injection points in the power distribution system, sensing one or more output signals at one or more sensing points in the power distribution system, and establishing a baseline signature for one or more of the points based on one or more of the output signals. The output signals at the sensing points may result from the injection of the input signals. Assessing the power distribution system includes injecting one or more input signals at one or more injection points in the power distribution system, sensing one or more output signals at one or more sensing points in the power distribution system, and assessing one or more conditions or components in the power distribution system by comparing the sensed output signals with information from the baseline signatures.

According to one embodiment, a method of assessing an electrical power distribution system includes generating a map of the power distribution system and assessing the power distribution system based on the map. Generating the map includes injecting one or more input signals (for example, a tone) at one or more injection points in the power distribution system, sensing one or more output signals at one or more sensing points in the power distribution system, and generating the map of the power distribution system based on one or more of the output signals. Assessing the power distribution system includes injecting one or more input signals at one or more injection points in the power distribution system, sensing one or more output signals at one or more sensing points in the power distribution system, and assessing one or more conditions or components in the power distribution system by comparing the sensed output signals with information from the map.

According to one embodiment, a system for assessing an electrical power distribution system includes one or more signal injection devices and one or more signal sensing devices. The signal injection devices can inject an input signal into the power distribution system at one or more points in the power distribution system. The signal sensing devices can sense, at one or more points in the power distribution system, an output signal resulting from injected input signals.

As used herein, "signal" includes an electrical or electromagnetic impulse, wave, tone, pulse, or combination thereof. A signal may have any of various regular or irregular characteristics. In some embodiments, a signal includes one or more repeating characteristics, such as a sine wave, a square wave, or a sawtooth wave. In some embodiments, a signal has non-repeating characteristics. A signal can be applied to, or transmitted through, a single conductor or to a set of two or more conductors. In certain embodiments, a signal is an electromagnetic signal transmitted through air (for example, a wireless signal).

As used herein, "tone" means a signal having one or more periodic characteristics. A tone may be, for example, a sine wave having a particular frequency and amplitude.

As used herein, "signature" means a characteristic or set of characteristics, such as a pattern or waveform, that can be used to identify a component, a set of components, operational conditions of a system or component, or a location in a system. For example, a signature may be used to detect that a particular device, such as an uninterruptible power supply, is coupled into a power distribution system. As another example, a signature may be used to detect that a particular power distribution unit has ceased to provide power to a set of servers in a data center. A signature may be established from output signals sensed at one or more points in a system. A signature may have any of various distinguishing characteristics. In some embodiments, a signature has distinguishing harmonic characteristics, such as a waveform having a particular shape, frequency, and amplitude. A signature may include elements of a carrier wave (such as a power transmission wave supplying power to electrical systems) and one or more additional signals (such as an injected signal). In some embodiments, a signature depends on the point of location from which the signature is sensed or observed.

As used herein, "power distribution unit" means any device, module, component, or combination thereof, that can be used to distribute electrical power. The elements of a power distribution unit may be embodied within a single component or assembly (such as a transformer and a rack power distribution unit housed in a common enclosure), or may be distributed among two or more components or assemblies (such as a transformer and a rack power distribution unit each housed in separate enclosure, and associated cables, etc.). A power distribution unit may include a transformer, power monitoring, fault detection, and isolation.

As used herein, "floor power distribution unit" refers to a power distribution unit that can distribute electrical power to various components in a computer room. In certain embodiments, a floor power distribution unit includes a transformer. In one embodiment, a floor power distribution unit includes a k-rated transformer. A power distribution unit may be housed in an enclosure, such as a cabinet.

As used herein, "rack power distribution unit" refers to a power distribution unit that can be used to distribute electrical power to various components in a rack. A rack power distribution may include various components and elements, including wiring, bus bars, connectors, and circuit breakers. In some embodiments, a rack power distribution unit may distribute power to only some of the electrical systems in a rack. In some embodiments, a single rack includes two or more rack power distribution units that distribute power to different sets of electrical systems in the rack. For example, one rack may include a left rack power distribution unit that distributes power to half of the servers in the rack, and a right rack power distribution unit that distributes power to the other half of the servers in the rack.

As used herein, a "cable" includes any cable, conduit, or line that carries one or more conductors and that is flexible over at least a portion of its length. A cable may include a connector portion, such as a plug, at one or more of its ends.

As used herein, "computer room" means a room of a building in which computer systems, such as rack-mounted servers, are operated.

As used herein, "computing" includes any operations that can be performed by a computer, such as computation, data storage, data retrieval, or communications.

As used herein, "computing device" includes any of various devices in which computing operations can be carried out, such as computer systems or components thereof. One example of a computing device is a rack-mounted server. As used herein, the term computing device is not limited to just those integrated circuits referred to in the art as a computer, but broadly refers to a processor, a server, a microcontroller, a microcomputer, a programmable logic controller (PLC), an application specific integrated circuit, and other programmable circuits, and these terms are used interchangeably herein. Some examples of computing devices include e-commerce servers, network devices, telecommunications equipment, medical equipment, electrical power management and control devices, and professional audio equipment (digital, analog, or combinations thereof). In various embodiments, memory may include, but is not limited to, a computer-readable medium, such as a random access memory (RAM). Alternatively, a compact disc-read only memory (CD-ROM), a magneto-optical disk (MOD), and/or a digital versatile disc (DVD) may also be used. Also, additional input channels may include computer peripherals associated with an operator interface such as a mouse and a keyboard. Alternatively, other computer peripherals may also be used that may include, for example, a scanner. Furthermore, in the some embodiments, additional output channels may include an operator interface monitor and/or a printer.

As used herein, "co-location" includes a facility in which computing systems for one or more customers are located in which networking, operation, and/or maintenance of the computing systems is at least partially outside the customer's control. A co-location facility for multiple customers may be controlled by a co-location operator. In some embodiments, a co-location operator provides facilities, networking services, and maintenance services for co-location customers.

As used herein, "data center" includes any facility or portion of a facility in which computer operations are carried out. A data center may include servers dedicated to specific functions or serving multiple functions. Examples of computer operations include information processing, communications, simulations, and operational control.

As used herein, a "module" is a component or a combination of components physically coupled to one another. A module may include functional elements and systems, such as computer systems, circuit boards, racks, blowers, ducts, and power distribution units, as well as structural elements, such a base, frame, housing, or container.

As used herein, "operating power" means power that can be used by one or more computer system components. Operating power may be stepped down in a power distribution unit or in elements downstream from the power distribution units. For example, a server power supply may step down operating power voltages (and rectify alternating current to direct current).

As used herein, a "rack" means a rack, container, frame, or other element or combination of elements that can contain or physically support one or more computing devices.

As used herein, "reserve power" means power that can be supplied to an electrical load upon the failure of, or as a substitute for, primary power to the load.

In various embodiments, a power distribution assessment system is coupled to a power distribution system supplying power to electrical systems. In some embodiments, the power distribution assessment system includes a signal injection device that injects an input signal into the power distribution system and one or more signal sensing devices that sense output signals resulting from the injected signal. The sensed output signals can be used to assess conditions and components in the power distribution system. For example, the power distribution assessment system can be used to detect electrical anomalies in the power distribution system, such as a failure of a component in the power distribution system.

FIG. 1 is a block diagram illustrating one embodiment of a power distribution assessment device coupled to a power distribution system for electrical systems in a data center. Data center 100 includes power distribution system 102 and electrical systems 104. Electrical systems 104 may include, for example, computing devices, rack-mounted servers, network control devices, power supply units, air moving devices, and mass storage devices. Electrical systems 104 may be supported in racks 106. Electrical systems 104 may perform various functions in the data center, such as data storage or network services. In one embodiment, computing devices 104 are servers in a server room of data center 100.

Data center 100 includes power assessment device 108. Power distribution assessment device 108 can be used to assess components or conditions in power distribution system 102.

Power distribution system 102 includes transformer 110, generators 112, switchgear apparatus 114, and primary power systems 116. Each of primary power systems 116 includes UPS 118 and one or more power distribution units ("PDUs") 120.

Electrical systems 104 in racks 106 may each receive power from one of primary power systems 116. In one embodiment, each of primary power systems 116 corresponds to, and provides power to, the servers in one room in data center 100. In one embodiment, each of primary power systems 116 corresponds to, and provides power to, one rack system in data center 100. In FIG. 1, for the sake of clarity, electrical systems 104 are shown coupled to only one of PDUs 120. Electrical systems may, however, be coupled to any or all of PDUs 120 in data center 100.

Power distribution units 120 may be floor power distribution units. In some embodiments, power distribution unit 120 includes a transformer that transforms the voltage from switchgear apparatus 114. Each of racks 106 may include one or more rack power distribution units 122. The rack power distribution units 122 may distribute power to computer systems 104.

Transformer 110 is coupled to a utility feed. The utility feed may be a medium voltage feed. In certain embodiments, the utility feed is at a voltage of about 13.5 kilovolts or 12.8 kilovolts at a frequency of about 60 Hz. Generators 104 may provide power to primary power systems 106 in the event of a failure of utility power to transformer 110. In one embodiment, one of generators 112 provides back-up power for each of primary power systems 116.

UPS 118 may provide uninterrupted power to racks 106 in the event of a power failure upstream from UPS 118. In certain embodiments, a UPS receives three-phase power from a transformer. The UPS may supply three-phase power to a floor power distribution unit.

PDU power may be any suitable voltage. In one embodiment, electrical power is about 208 V. In one embodiment, electrical power is about 230 V. In some embodiments, different electrical systems 104 may operate on different phases of a primary power system. Each of the legs may correspond to one phase of the input power. In one embodiment, each leg operates at a voltage between about 220 volts to about 260 volts.

In operation of data center 100, receptacles in rack PDU 122 may be used to supply power to electrical systems in rack 106, such as servers. Electrical systems 104 may be coupled to rack power distribution unit 122 by way of cables.

Each of the legs in rack PDU 122 may include a breaker. In one embodiment, each breaker is a 30 A/32 A single pole MCB. Breakers may be located such that they can be accessed when server racks are in-line (e.g., at the top of rack power distribution unit 126). In one embodiment, power is provided to a rack PDU by way of an 8AWG/6 mm$^2$ 5 core cable and a 30 A NEMA/32 A IEC309 3Ph+N+E Plug.

Reserve power system 130 may provide reserve power for any or all of the electrical systems 104 supplied by primary power systems 116. In some embodiments, reserve power system 130 is powered up at all times during operation of data center 100. Reserve power system 130 may be passive until a failure of one or more components of the primary power system for one or more of electrical systems 104, at which time reserve power system 130 may become active.

For illustrative purposes, three switchgear apparatus 114, four UPSs 118, and ten PDUs 120 are shown in FIG. 1. The number of power distribution units, UPSs, switchgear apparatus may, however, vary from embodiment to embodiment (and, within a given embodiment, from system to system). For example, each of UPSs 118 may supply power to any suitable number of power distribution units 120. As another example, each of switchgear apparatus 114 may supply power to any suitable number of UPSs 118.

Power distribution assessment device 108 is coupled to power distribution system 102 at a point between PDU1 and electrical systems 104. Power distribution assessment device 108 includes tonal tracer 142. Tonal tracer 108 can be used for tracing connections and conditions and power distribution system 102. In certain embodiments, a tonal tracer system is coupled to power distribution unit using connectors on the power distribution unit. For example, tonal tracer 142 can be plugged into an output receptacle to PDU1. In certain embodiments, a power assessment distribution system is connected at a rack PDU level. In one embodiment, tonal tracer may be plugged into one or more C-19 power receptacles.

Tonal tracer 108 includes signal injection device 144 and signal sensing device 146. Signal injection device 144 can inject input signal 148 into PDU1 at injection point 149. The input signal may be, for example, a tone. The injected signal may propagate through at least part of power distribution system 102. As the signal propagates through power distribution system 102, the signal may be altered, transformed, delayed, or attenuated.

In some embodiments, the signal is injected during operation of the power distribution system to supply power to electrical systems. The injected signal may appear as a modulation of an existing wave or signal in a power distribution system. For example, the injected signal may appear as a modulation of a sinusoidal wave from power transformer 102 (for example, a 60 Hertz sinusoidal wave) that is used to transmit power to electrical systems 104. An injected signal may have any of various forms. In one embodiment, an injected signal is a tone at a defined frequency and amplitude.

In FIG. 1, arrows are used to illustrate one example of a signal propagating through power distribution system 102. At PDU1, the signal is injected into power distribution system 102 by signal injection device 144 of tonal tracer 142. The signal may propagate upstream in the form of signal 150 from PDU1 to UPS 1, and in the form of signal 152 from UPS 1 to switchgear apparatus 1. From switchgear apparatus 1, the signal may propagate from switchgear apparatus 1 in the form of signals 154 to components downstream from switchgear apparatus 1, namely to UPS 1, UPS 2, and UPS 3 From UPS1, UPS2, and UPS3, the signal may propagate in the form of signals 156 to components downstream from the UPSs, namely PDU 1 through PDU n.

A power distribution assessment system may sense output signals one or more locations in a power distribution system. In the embodiment shown in FIG. 1, for example, tonal tracer 142 includes signal sensing device 146. Signal sensing device 146 may detect signal 160 as signal 160 passes out of PDU1.

Each of signals 150, 152, 154, and 156 may be altered from injection signal 148 that was injected by signal injection device 144 at PDU1. Nevertheless, signals 150, 152, 154, and 156 have characteristics (amplitude, shape, etc.) that are measurable by a sensing device and traceable back to injection signal 148.

In some embodiments, output signals resulting from an injected signal may be used to define signatures for a power distribution system. The signatures may be associated with a particular component in a power distribution system, a combination of components (a primary power system with a particular UPS and a particular set of PDUs), or a point or location in the power distribution system.

In some embodiments, signatures for a power distribution system are a function of: the characteristics and arrangement of power distribution components in the power distribution system (for example, the type of transformer), the character of the injected signal (for example, its waveform, frequency, and amplitude), the location of signal injection, and the location of the sensing device. Thus, for example, the signature established from sensing signal 156a between UPS 3 and PDU 7 may be different than the signature established from sensing signal 156c between UPS 3 and PDU 9. In addition, an output signal at PDU 9 might change if UPS 1 were to fail, or to be replaced by a UPS of a different type.

In some embodiments, output signals resulting from an injected signal are used to create a signature map for a power distribution system. The signature map may be based on signals sensed at various locations in the power distribution system. For example, in the embodiment shown in FIG. 1, a signature can be established based on sensing an output signal at each of PDUs 120, UPSs 118, and switch gear apparatus 114.

In some embodiments, a baseline set of signatures is established. The signatures in the map may be stored in a database. At a later time, during operation of the power distribution system, the signals used to produce the signature may be re-acquired. The re-acquired signals can be compared with baseline signatures. The comparisons may be used to assess conditions or components in the power distribution system. For example, a difference between a baseline signature at a given location and re-acquired signals at the same location may indicate that the configuration of the power distribution system has changed since the baseline signature was established.

In some embodiments, a power distribution assessment system may be used to detect or trace electrical anomalies in the power distribution system. Such electrical anomalies may include a failure or out-of-tolerance condition of a component in the distribution chain. For example, if a signature determined based on an output signal at signal 154a changes from an established baseline signature, the change may be an indicator that switch gear 1 has failed, or is generating power that is no longer within acceptable tolerances.

In some embodiments, a power distribution assessment system is used to assess conditions or components in a power distribution system having multiple phase output. In one embodiment, the power distribution system has a three phase output. The signature at any given point in the system may reflect the phase of the line. For example, signals 156a, 156b, and 156c may each be carried on a line that is on a different phase or phase combination (for example, AB, BC, and CA), and thus the signature for each of signals 156a, 156b, and 156c may reflect the phase difference. In some embodiments, a separate input signal is injected on each phase or phase combination in the power distribution system.

Figure 2:
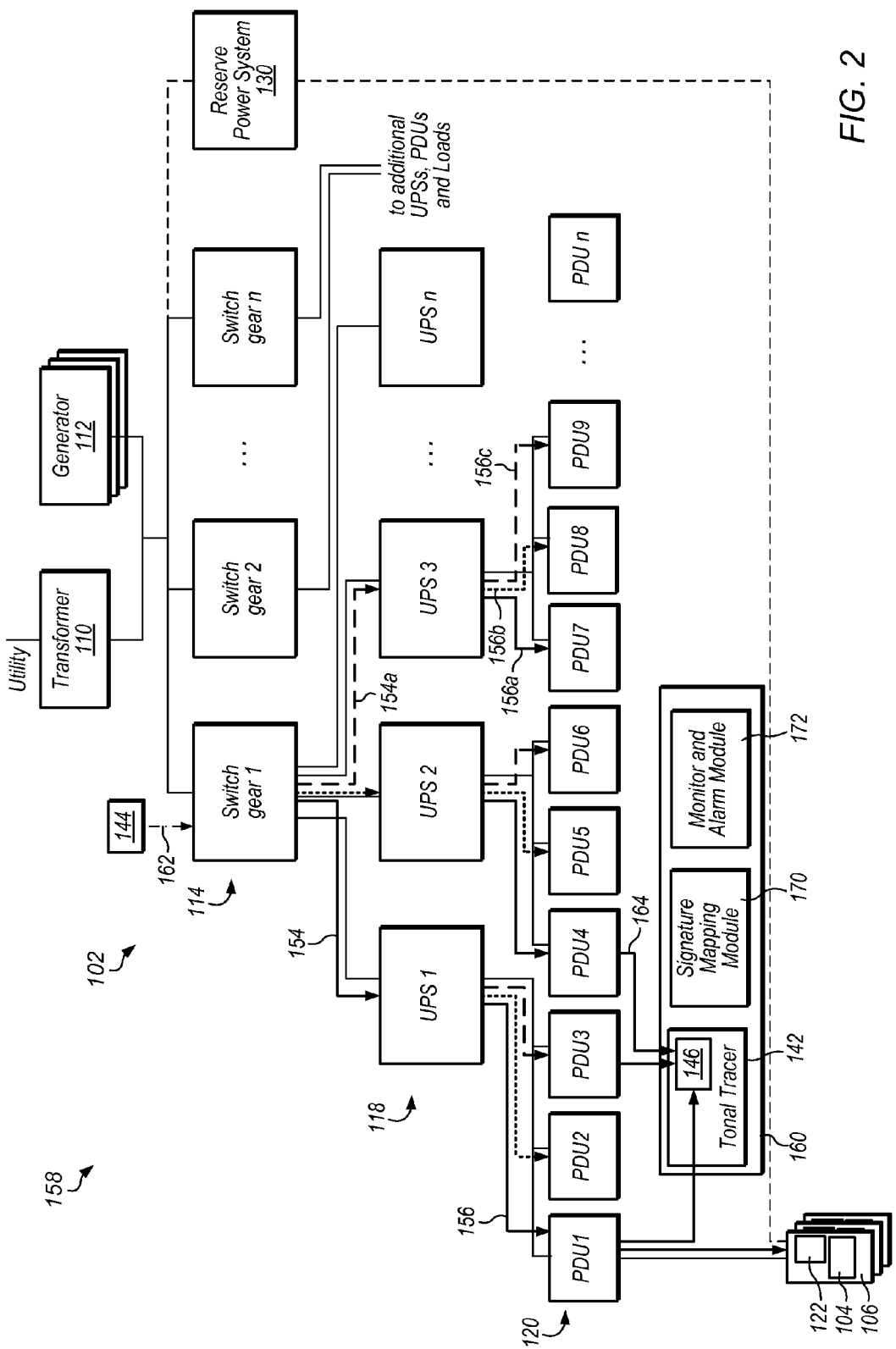
FIG. 2 illustrates one embodiment of a power distribution assessment system having a signature mapping module and an alarm module.

In some embodiments, a power distribution assessment system creates and store signature maps for one or more power distribution systems. In some embodiments, a power distribution assessment system can activate or send an alarm (if, for example, conditions in the power distribution require intervention by maintenance personnel). FIG. 2 illustrates one embodiment of a power distribution assessment system having a signature mapping module and an alarm module. Data center 158 includes power distribution assessment system 160. Power distribution assessment system 160 includes tonal tracer 142, signature mapping module 170, and monitor and alarm module 172. Signal injection device 144 injects signal 162 at switchgear 1. The injected signal propagates from switchgear 1 downstream through components in power distribution system 102. Sensing module may sense output signals 164 coming out of PDUs 120. Output signals 164 may result from injected signal 162.

Signature mapping module 172 may be coupled to tonal tracer 142. Signature mapping module may create and store signature maps in a memory. The signature maps may be based on data received in sensing device 146. Signatures from the map may be retrieved from memory for use in assessing conditions in the power distribution system.

Monitor and alarm module 172 may assess and monitor conditions in power distribution system 102. In certain embodiments, signatures for power distribution system 102 are periodically updated. In the event of an electrical anomaly, monitor and alarm module 172 may send or activate an alarm. In one embodiment, monitor and alarm module 172 triggers an audible alarm.

As is illustrated in FIG. 2, in some embodiments, a signal can be injected into a power distribution system such that the signal propagates downstream through the power distribution system. For example, in the embodiment shown in FIG. 2, the power distribution assessment system injects signal 162 at switchgear 1, which then propagates downstream through UPSs 118 and PDUs 120 of power distribution system 102. In certain embodiments, an injected signal may propagate both upstream and downstream from the point of injection.

Figure 3:
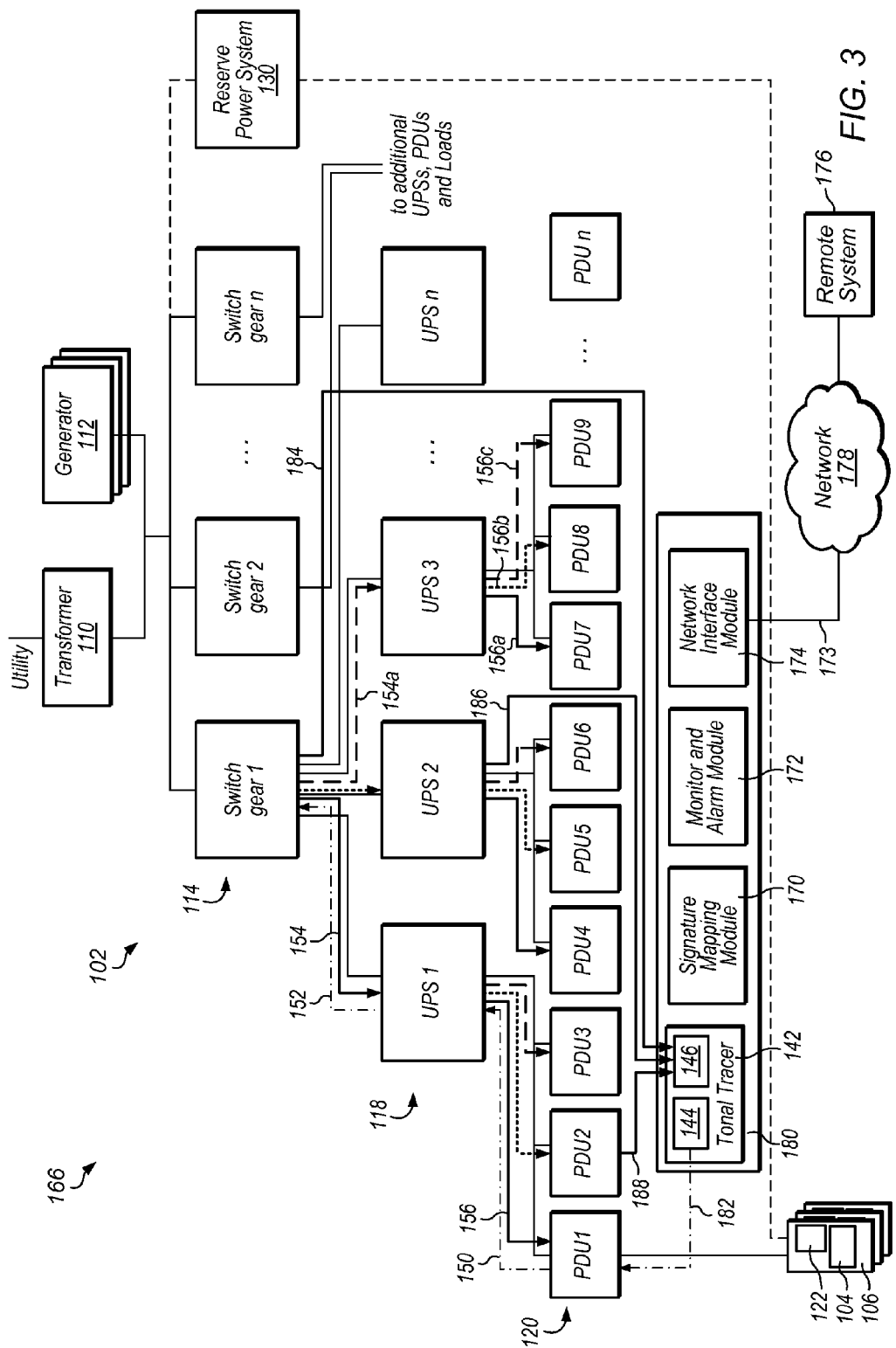
FIG. 3 illustrates one embodiment of a power distribution assessment system in which output signals from an injected signal are sensed at multiple levels in a power distribution system.

In some embodiments, a power distribution assessment system senses output signals at two or more levels in the power distribution system. FIG. 3 illustrates one embodiment in which output signals from an injected signal are sensed at multiple levels in a power distribution system. Data center 166 includes power distribution assessment system 180. Power distribution assessment system 180 includes tonal tracer 142, signature mapping module 170, monitor and alarm module 172, and network interface module 174.

Tonal tracer 142 may inject signal 182 upstream into power distribution unit 102 through PDU1. The injected signal may propagate in a manner similar to that described above relative to FIG. 1.

Signal sensing device 102 may sense output signals 184 from one or more of switchgear apparatus 114, output signals 186 from one or more of UPSs 118, and output signals 188 from one or more of PDUs 120. For the sake of clarity, in FIG. 3, an output signal is shown for only one component at each level in FIG. 3. Nevertheless, in some embodiments, an output signal may be sensed for any or all of the components in power distribution system 102. The output signals may be used to create a signature map for power distribution system 102.

Output signals 184, 186, and 188 may be transmitted to signal sensing device 146 by any manner. In some embodiments, cables are used to couple signal sensing device 146 at the desired sensing points. In this arrangement, signal sensing device 146 may remain at one location. In some embodiments, signal sensing device 146 is a portable device that can be moved to each of the desired sensing points.

Power distribution assessment system 180 is coupled to network 178 by way of lines 173. Lines 173 may each be, in various embodiments, a cable, an electrical bus, or a combination thereof. In certain embodiments, lines 173 include a wireless connection between power distribution assessment system 180 and the coupled element. In certain embodiments, line 142 includes a wireless connection between power monitor module 108 and network 178.

In some embodiments, power distribution assessment module 108 includes a microprocessor that implements program instructions for monitoring and reporting on power distribution system 102. In some embodiments, some or all of the components of the power distribution assessment system 180 are contained in an enclosure. The enclosure may be mounted inside the rack, on the rack, or at another location.

In some embodiments, a method of using a power distribution assessment system includes reporting to a system external the monitor (for example, a remote computer system). For example, a message may be sent over a network to a remote computer that power has been lost in a particular PDU supplying power in a data center.

Network interface module 174 may exchange data and signals between power distribution assessment module 108 and remote system 176 over network 178. In one embodiment, network interface module 174 is an Ethernet card. In another embodiment, network interface module 148 provides for a fiber optic transmission of data. In some embodiments, some or all of the components in power distribution system 102 are each assigned an address. If a fault condition exists, a send a fault message to remote system 176 over network 178. The message may include the appropriate address to identify the failed component.

In some embodiments, messages are sent from power distribution assessment system 180 using Simple Network Management Protocol (SNMP) data (for example, an SNMP trap). Any network protocol, however, may be used in various embodiments to send data from, or receive data into, power distribution assessment system 180.

In some embodiments, power distribution assessment system 180 may control an alarm at the location of the rack PDUs. For example, an audible alarm (such as a buzzer or siren) or a visual alarm (flashing light). Upon failure of a component in the power distribution assessment system, the power distribution assessment system may trigger the alarm.

In some embodiments, a power distribution assessment system (such as power distribution assessment system 180) is rack-mountable. In one embodiment, an enclosure for a power distribution assessment system includes rack ears to allow the power distribution assessment system to be installed in a rack. In one embodiment, power distribution assessment system 180 mounts in a 1 U slot in a 19 inch standard rack. A power distribution assessment system may, however, be any shape and size. In certain embodiments, a power distribution assessment system has a "zero U" form factor that allows installation in a rack such that the system does not consume any of the slots in the rack.

Figure 4:
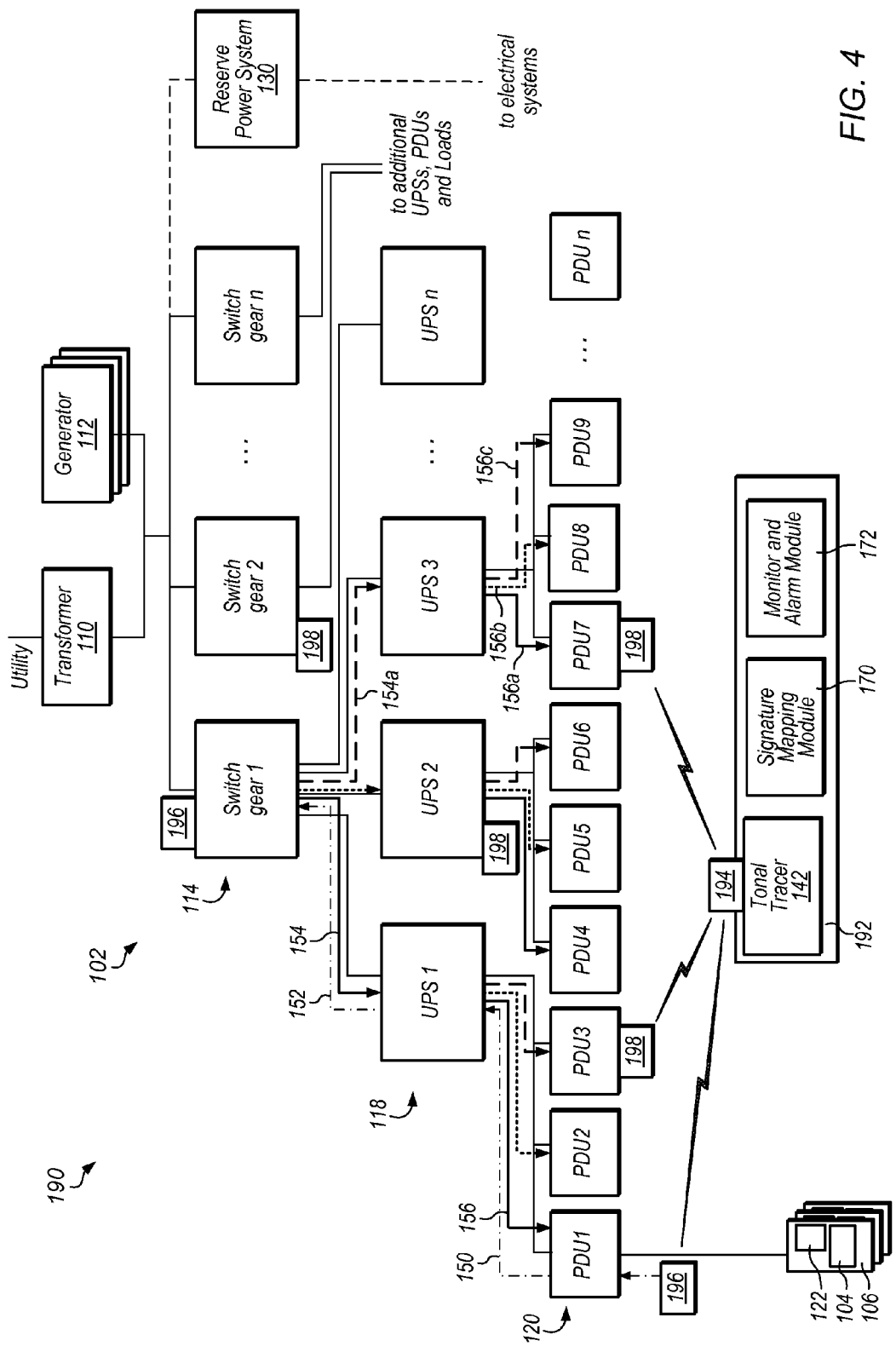
FIG. 4 illustrates one embodiment of a power distribution assessment system that includes a wireless connection to signal injection devices and signal sensing devices.

In some embodiments, a power distribution assessment system is coupled to signal injection devices or signal sensing devices by a wireless connection. FIG. 4 illustrates one embodiment of a power distribution assessment system that includes a wireless connection to signal injection devices and signal sensing devices. Data center 190 includes power distribution assessment system 192. Power distribution assessment system 192 includes tonal tracer 142 and wireless transmitter/receiver 194. Signal injection devices 196 and signal sensing devices 198 are coupled to various components in power distribution system 102. Each of signal injection devices 196 and signal sensing devices 198 may include a wireless transmitter/receiver. Tonal tracer 142 exchanges data with signal injection devices 196 and signal sensing devices 198 by way of wireless transmitter/receiver 194.

In some embodiments, one or more baseline signatures are established by injecting signals into the power distribution system. During operation of the power distribution system to supply power to loads, the signals may be re-injected, and sensed output signals compared to information from the baseline signatures. Conditions or components in the power distribution system may be assessed based on the comparisons with the baseline signature information.

Figure 5:
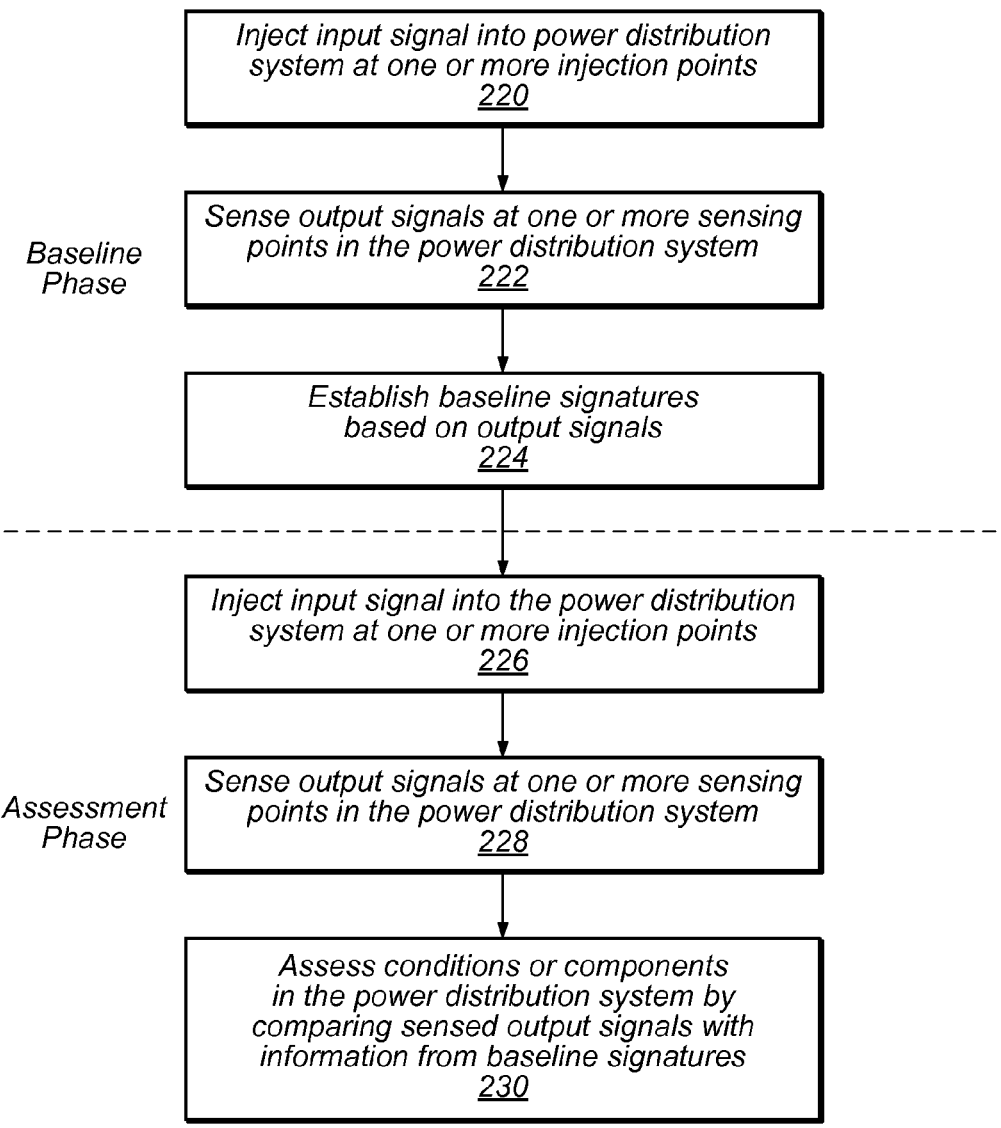
FIG. 5 illustrates one embodiment of assessing an electrical power distribution system using an injected signal.

FIG. 5 illustrates one embodiment of assessing an electrical power distribution system using an injected signal. At 220 to 224, a baseline phase is carried out. At 220, input signals are injected at one or more injection points in a power distribution system. The injected signal may be, for example, a tone having a particular frequency and amplitude. The signal may be applied to one conductor, or to a set of two or more conductors. For example, the signal may be applied to a pair of conductors transmitting power for a particular phase in the power distribution system.

In various embodiments, input signals may be injected at any point in the power distribution system. In one embodiment, a signal is injected upstream from one or more switchgear apparatus. In another embodiment, a signal is injected at the utility power level.

In some embodiments, an injection point for an injected signal is at a different level in the power distribution system than the sensed point for an output signal. For example, the injected signal may be applied at the UPS level, and an output signal sensed at the PDU level.

In certain embodiments, a transformer is between the point of injection and the point of sensing. For example, in the embodiment shown in FIG. 2, if PDU4 includes a transformer (for example, a K-15 transformer), the signal injected at UPS 1 will be applied to the transformer on the input side, while output signal 164 will be on the output side of the transformer.

At 222, output signals are sensed at one or more sensing points in the power distribution system. The output signals at the sensing points may be a result of the injection of the input signals. Any of various sensors or instruments may be used to sense output signals. In one embodiment, a sensor plugs into one or more connector receptacles on a component of the power distribution system. In one embodiment, a sensor includes a coil or other apparatus placed in proximity with conductors in the power distribution system (for example, an instrument transformer).

At 224, a baseline signature for each of the points may be established based on one or more of the output signals. In some embodiments, the signature reflects the components that are included in the power distribution system. For example, referring to FIG. 1, an output signature based on signal 156c may differ depending on the type and configuration of UPS 3 and switch gear 1. In some embodiments, the signature includes harmonic characteristics of the output signal.

At 226 to 230, the power distribution system is assessed. In certain embodiments, assessment is performed at a periodical interval (for example, once a week). In certain embodiments, assessment is performed on a continuous basis (for example, continuously monitoring for changes in the power distribution system).

At 226, input signals are injected at one or more injection points in the power distribution system. The input signals may be identical to the signals that were injected in the baseline phase. In addition, the signals may be injected at the same injection points as in the baseline phase.

At 228, output signals are sensed at one or more sensing points in the power distribution system. The output signals at the sensing points may be a result of the injection of the input signals.

At 230, conditions or components in the power distribution system are assessed. Assessments may be made, for example, by comparing the sensed output signals with information from the baseline signatures. A change in the signature from the baseline signature may reflect a change or anomaly in the power distribution system. For example, if UPS 3 has been replaced by a UPS of a different type, the signature derived from signals 156a, 156b, or 156c may change from the baseline signature.

In various embodiments, assessment of the power distribution system may include: identifying a change in the configuration of components in a system, identifying an electrical anomaly (such as a faulty component or group of components), identifying the type of a component that is actually installed (such as a type of transformer having a particular output), or identifying components that have been added or removed since the baseline was established. In each case, the assessment may be based, at least in part, on a comparison of current output signals with baseline signature information.

In some embodiments, baseline signatures are updated on a periodic basis (for example, once a day, or once a week). In certain embodiments, the last reading taken for a given point may serve as the baseline signature for that point. In certain embodiments, a power distribution system may be continuously monitored using signature comparisons.

In some embodiments, a map for a power distribution system is generated by injecting signals into the power distribution system. During operation of the power distribution system to supply power to loads, the signals may be re-injected, and sensed output signals may be compared to information from the baseline signatures.

Figure 6:
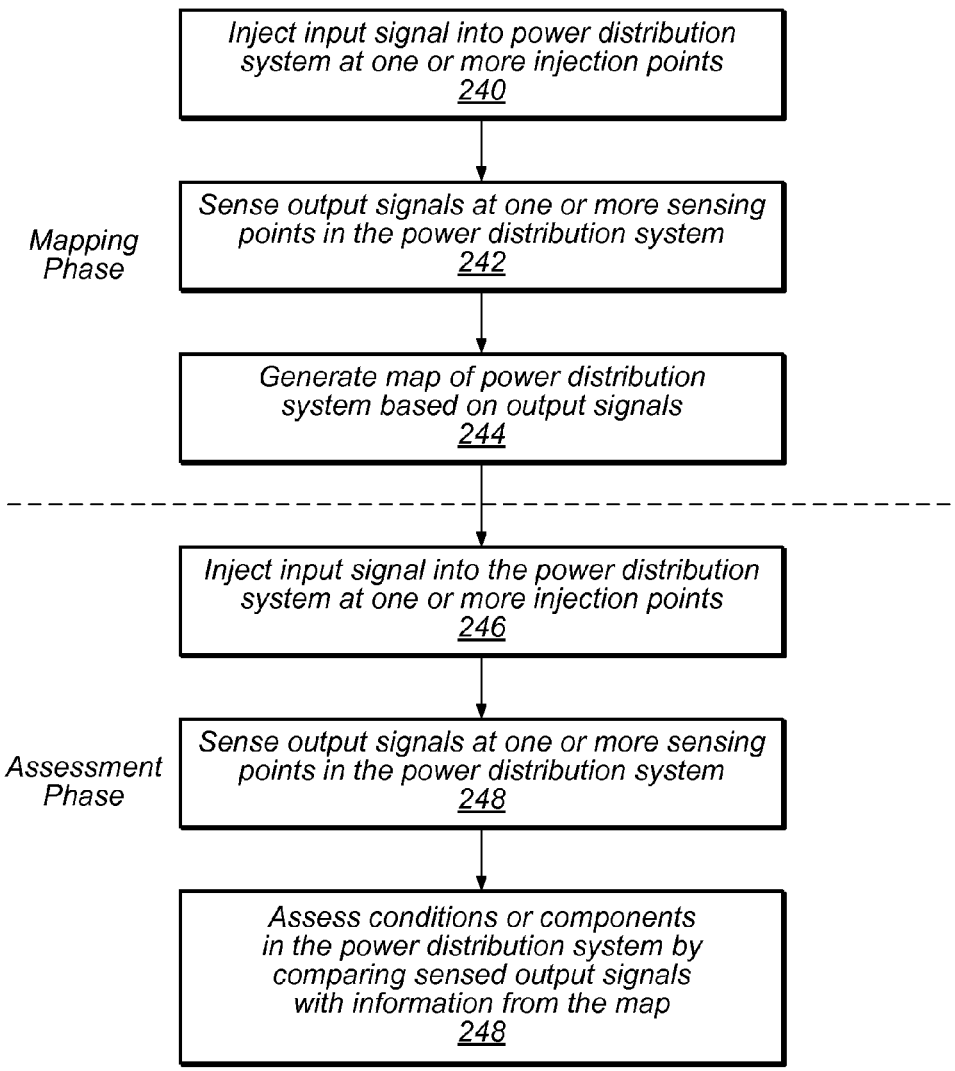
FIG. 6 illustrates one embodiment of assessing an electrical power distribution system using a map generated from injected signals.

FIG. 6 illustrates one embodiment of assessing an electrical power distribution system using a map generated from injected signals. At 240 through 244, a map generation phase is carried out. At 240, input signals are injected at one or more injection points in the power distribution system. At 242, output signals are sensed at one or more sensing points in the power distribution system. The output signals at the sensing points may result from the injection of the input signals.

At 244, a map of the power distribution system is generated based on one or more of the output signals. In certain embodiments, generating the map involve personnel moving a sensor from one location to another in the power distribution system until a suitable number of locations has been checked. In other embodiments, sensors may be already in place on various components, and the output signals acquired automatically. In one embodiment, a signature is established for all components in the power distribution system (for example, sensing an output signal at the transformer, each switchgear apparatus, each UPS, and each floor PDU). In other embodiments, signatures are established based on output signals acquired at representative points in the power distribution system.

At 246 through 250, the power distribution system is assessed. At 246, input signals are injected at one or more injection points in the power distribution system. The input signals may be identical to the signals that were injected in the map generation phase. In addition, the signals may be injected at the same injection points as in the map generation phase.

At 248, output signals are sensed at one or more sensing points in the power distribution system. The output signals at the sensing points may result from the injection of the input signals.

At 250, conditions or components in the power distribution system are assessed. The assessment may be made, for example by comparing the sensed output signals with information from the map of the power distribution system. The nature of the assessments may be similar to that described above relative to FIG. 5.

In some embodiments, an assessment includes identifying the portion of a power distribution system that is affected by a change, anomaly, or failure. The portion may be, for example, a subset of components of the power distribution system. For example, referring to FIG. 1, if the signatures derived from signals 156a, 156b, and 156c changes, but all other signatures are unchanged from the baseline, the system may determine that UPS 3 has failed and that all the components downstream from UPS 3 (PDU7, PDU 8, PDU 9 and the rack systems connected to such PDUs) are at risk.

Upon determining that a subset of components is at risk, the system may generate an alarm. The alarm may provide personnel with a warning that corrective action may be required for the components in the potential blast radius. In one embodiment, a system automatically queries whether reserve power is in place for the components in the potential blast radius (e.g., the system is set to fail over to the reserve power if the primary power components fail). If reserve power is not in place, the system may automatically take corrective action or send an alarm.

In some embodiments, an assessment includes a query about the location of an output signal (for example, a "What am I connected to?" query). For example, while a signal is being injected, an operator may plug a sensor into a particular location (for example, "Rack 29") and acquire an output signal. The output signal may be compared with the map to generate information about the sensor's position relative to components in the system. For example, referring to FIG. 1, if a user plugs as sensor into a rack connected to PDU 1, the assessment system may use signature information from the map to determine that the rack is connected to Switch gear 1, UPS 1, and PDU 1.

In some embodiments, a map for a power distribution system is updated from time to time. The map may be updated, for example, on a periodic basis (such as daily or weekly), or after each maintenance event. The map update may capture changes to the components and connections in the power distribution system.

In some embodiments, a power distribution assessment system sends out a periodic status message for the power distribution system being monitored.

In some embodiments, a remote system may manage one or more power distribution assessment systems. In certain embodiments, a remote system may query power distribution assessment systems, for example, by way of a message over a network. In some embodiments, trend analysis for one or more power distribution systems may be carried out using data from one or more power distribution assessment systems, either on a power distribution assessment system or on a remote system receiving data from the power distribution assessment systems.

In some embodiments, a power distribution assessment system may perform, or provide data for, statistics or trend analysis one or more components in the system. For example, a power distribution assessment system may determine a percentage of time a particular UPS or a particular PDU has been down during a particular period of time.

Figure 7:
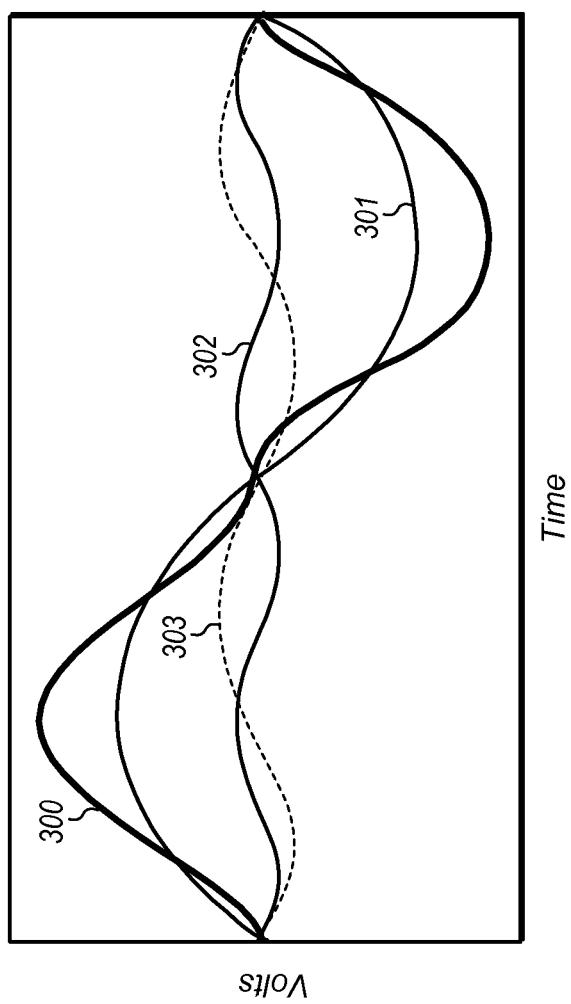
FIG. 7 illustrates one embodiment of a waveform measured by a power distribution assessment system.

In various embodiments, a power distribution assessment system uses harmonic signatures to assess a power distribution system. FIG. 7 illustrates one embodiment of a waveform measured by a power distribution assessment system.

Waveform 300 may be a composite of harmonic components. Waveform 300 may reflect, for example, contributions of fundamental 301, harmonic 302, and harmonic 303. In one embodiment, fundamental 301 is about 60 Hz. Different systems, components, and transformations in the power distribution system may alter a signature of the power distribution system (for example, add to or subtract from the amplitude of a waveform).

In various embodiments, a power distribution assessment determines a signature based on one or more harmonics. In various embodiments, for example, a signature may be based on a second harmonic, a third harmonic, or both. The harmonics may be sensed at one or more points in the power distribution system. The harmonics may be traced and trended. The power distribution system may assess electrical anomalies or configuration changes based on changes in harmonics in the signatures.

In some embodiments, filters are applied to injected or sensed signals. In one embodiment, different filters are applied to a tonal unit to establish a spectrum of prints and to produce a map of the system.

In various embodiments described above, assessment is described as occurring in phases. In some embodiments, phases are carried out in succession, for example, mapping phase at one point in time (for example, an initial mapping) followed by an assessment phase at a later point in time (for example, while troubleshooting a fault with the power distribution system in service). In some embodiments, however, the elements of the multiple phases are carried out concurrently. For example, a baseline signature may be established concurrently with assessment of the power distribution system. In some embodiments, mapping of a power distribution system is carried out concurrently with assessment of the power distribution system. In some embodiments, the frequency of an injected signal is altered over time. The alteration in the signal may be detected with a sensing device. The alterations in the signal may be used to assess the power distribution system and its components.

In various embodiments described above, power distribution monitoring is carried out for computing systems (for example, servers) in a data center. Nevertheless, monitoring may be carried out for power distribution to any type of electrical system. Examples include hospital equipment, utility systems, security systems, military systems, telecommunications systems, or electronic commerce systems. In certain embodiments, power distribution monitoring is carried out for a critical system, such as a life support system.

Although in various embodiments described above, a power distribution assessment relied on an injection signal applied at a single injection point, signals may be applied at any number of injection points in a system.

Although the embodiments above have been described in considerable detail, numerous variations and modifications will become apparent to those skilled in the art once the above disclosure is fully appreciated. It is intended that the following claims be interpreted to embrace all such variations and modifications.

What is claimed is:

1. A method, comprising:
    generating a map of at least a portion of a power distribution system included in a data center and configured to distribute electrical power to at least one rack computer system, wherein generating the map comprises:
        injecting one or more input signals at one or more output receptacles of one or more power distribution components in the power distribution system such that the one or more input signals propagate through at least one power distribution component of the plurality of power distribution components in the power distribution system via one or more electrical conductors coupled to the power distribution components, wherein the power distribution components comprise one or more of:
            an electrical power transformer configured to transform utility power received at the data center,
            a switchgear apparatus configured to selectively distribute electrical power from a selected one of the transformer or an electrical generator; or
            an uninterruptible power supply configured to provide uninterrupted power to rack computer systems in the event of a power failure upstream from the uninterruptible power supply;
        sensing one or more output signals at one or more output receptacles of one or more power distribution components, wherein the one or more output signals at the one or more output receptacles result, at least in part, from the propagation of the one or more input signals through at least one of the plurality of power distribution components and cumulative alteration of the one or more input signals via successive propagation through each of the at least one of the plurality of power distribution components;
        based on the one or more output signals, determining separate baseline signatures for each of the plurality of power distribution components, wherein each baseline signature is associated with a separate alteration of the one or more input signals via propagation through a separate respective power distribution component of the plurality of power distribution components; and
        generating the map of the power distribution system based on one or more of the output signals, wherein the map includes the baseline signatures corresponding to each of the plurality of power distribution components; and
    assessing the power distribution system, wherein assessing the power distribution system comprises:
        injecting one or more input signals, using a power assessment device, at one or more output receptacles of a particular power distribution component, such that the one or more input signals initially propagate upstream through the plurality of power distribution components via one or more electrical conductors coupled to the power distribution components to a particular upstream power distribution component, via one or more electrical conductors coupled to the power distribution components, and subsequently propagate downstream from the particular upstream power distribution component and through the plurality of power distribution components to the same particular power distribution component;

sensing one or more output signals, using the same power assessment device, at one or more output receptacles of the same particular power distribution component, wherein the one or more output signals at the one or more output receptacles result, at least in part, from the initial propagation of the one or more input signals upstream through the plurality of power distribution components and subsequent propagation of the one or more input signals downstream through the plurality of power distribution components, wherein the one or more output signals are cumulatively altered from the one or more input signals via successive propagation through each of the plurality of power distribution components; and assessing a power distribution condition of at least one of the power distribution components in the power distribution system by comparing the sensed one or more output signals received at the one or more output receptacles of the same particular power distribution component at which the one or more input signals are injected with one or more baseline signatures included in the map.

2. The method of claim 1, wherein generating of at least a portion of the map of the power distribution system is concurrent with assessing at least a portion of the power distribution system.

3. The method of claim 1, wherein assessing one or more conditions or components in the power distribution system comprises assessing one or more deviations from at least one baseline signature in the map, wherein assessing deviations from the baseline signature comprises comparing one of the sensed output signals to at least one of the output signals used to generate the map.

4. The method of claim 1, wherein assessing one or more conditions or components in the power distribution system comprises detecting a change in the configuration of the power distribution system from the configuration at the time the map was generated.

5. The method of claim 1, wherein assessing one or more conditions or components in the power distribution system comprises detecting an electrical anomaly in the power distribution system.

6. The method of claim 1, wherein assessing one or more conditions or components in the power distribution system comprises the loss or failure of a component in the power distribution system.

7. The method of claim 1, wherein assessing one or more conditions or components in the power distribution system comprises identifying a component or a type of component in the power distribution system.

8. A method of assessing an electrical power distribution system, comprising:
establishing a plurality of baseline signatures for a plurality of power distribution components in the power distribution system, wherein the establishing the plurality of baseline signatures comprises:
injecting one or more input signals at one or more output receptacles of at least one power distribution component, such that the one or more input signals propagate through at least one power distribution component of the plurality of power distribution components in the power distribution system, via one or more electrical conductors coupled to the power distribution components;

sensing one or more output signals at one or more output receptacles of at least one power distribution component, wherein the one or more output signals at the one or more output receptacles result, at least in part, from the propagation of the one or more input signals through the at least one power distribution component and cumulative alteration of the one or more input signals via successive propagation through each of the at least one of the plurality of power distribution components in the power distribution system; and based on the one or more output signals, establishing the plurality of baseline signatures for the plurality of power distribution components, wherein each baseline signature is associated with a separate power distribution component of the plurality of power distribution components and indicates a particular alteration of the one or more input signals caused via propagation through the separate respective power distribution component of the plurality of power distribution components; and assessing the power distribution system, wherein assessing the power distribution system comprises:
injecting one or more input signals, using a power assessment device, at one or more output receptacles of a particular power distribution component, such that the one or more input signals initially propagate upstream through the plurality of power distribution components to a particular upstream power distribution component, via one or more electrical conductors coupled to the power distribution components, and subsequently propagate downstream from the particular upstream power distribution component and through the plurality of power distribution components to the same particular power distribution component;

sensing one or more output signals, using the same power assessment device, at one or more output receptacles of the same particular power distribution component, wherein the one or more output signals at the one or more output receptacles result, at least in part, from the initial propagation of the one or more input signals upstream through the plurality of power distribution components and subsequent propagation of the one or more input signals downstream through the plurality of power distribution components, wherein the one or more output signals are cumulatively altered from the one or more input signals via successive propagation through each of the plurality of power distribution components in the power distribution system;

based upon the one or more output signals received at the same particular power distribution component at which the one or more input signals are injected, determining a present signature associated with one power distribution component of the plurality of power distribution components, where the one power distribution component is separate and upstream from the particular power distribution component in the power distribution system; and assessing one or more conditions of the one power distribution component based at least in part upon a comparison of the determined present signature associated with one power distribution component with a corresponding baseline signature associated with the one power distribution component;

wherein the plurality of power distribution components are configured to distribute electrical power to at least one electrical load and comprise one or more of:

an electrical power transformer configured to transform utility power, a switchgear apparatus configured to selectively distribute electrical power from a selected one of the transformer or an electrical generator, or an uninterruptible power supply configured to provide uninterrupted power to rack computer systems in the event of a power failure upstream from the uninterruptible power supply.

9. The method of claim 8, wherein establishing a baseline signature for at least one of the power distribution components based on one or more of the output signals comprises generating a map of the power distribution based on the output signals.

10. The method of claim 8, wherein:

the one or more output signals comprises a waveform that is a composite of the one or more input signals and a plurality of harmonic signatures, each harmonic signature is associated with a separate power distribution component through which the input signal propagates, establishing the plurality of baseline signatures for the plurality of power distribution components includes processing the one or more output signals to resolve the plurality of harmonic signatures, wherein each of the resolved harmonic signatures is a baseline signature associated with a separate power distribution component of the power distribution system, comparing the determined present signature with the corresponding baseline signature includes:

processing the sensed output signals to determine at least one of the harmonic signatures, each of the at least one determined harmonic signatures is a present signature associated with a separate power distribution component, and comparing at least one determined present signature associated with one of the power distribution components with a corresponding baseline signature associated with the one of the power distribution components.

11. The method of claim 8, further comprising monitoring an output signal from at least one of the sensing points during operation of the power distribution system to supply power to electrical systems.

12. The method of claim 8, further comprising generating a map of the power distribution system based on signatures at two or more sensing points.

13. The method of claim 12, further comprising updating the map of the power distribution system based on one or more changes to the power distribution system.

14. The method of claim 12, wherein assessing one or more conditions or components in the power distribution system comprises identifying, based on information from the map, a portion of the power distribution system affected by an electrical anomaly or by an actual or potential failure of a power distribution component in the power distribution system.

15. The method of claim 12, wherein assessing the power distribution system comprises identifying, based on information from the map, a location or connection associated with one or more output signals relative to one or more power distribution components in the power distribution system.

16. The method of claim 8, wherein at least one of the sensed output signals is acquired from the same component as that of at least one of the injected input signals.

17. The method of claim 8, wherein at least one of the sensed output signals is acquired from a different component than that of at least one of the injected input signals.

18. The method of claim 8, wherein at least one of the injection points is upstream from at least one power distribution unit.

19. The method of claim 8, wherein at least one of the baseline signatures is established concurrent with assessing at least a portion of the power distribution system.

20. A system for assessing an electrical power distribution system, comprising:

a power distribution assessment device configured to assess an electrical power distribution system which comprises a plurality of power distribution components, wherein the power distribution assessment device comprises:

one or more signal injection devices, wherein at least one of the signal injection devices is configured to inject an input signal into one or more output receptacles of a particular power distribution component such that the input signal initially propagates upstream through a plurality of power distribution components, via one or more electrical conductors coupled to the power distribution components, to a particular upstream power distribution component, via one or more electrical conductors coupled to the power distribution components, and subsequently propagates downstream from the particular upstream power distribution component and through the plurality of power distribution components to the same particular power distribution component;

one or more signal sensing devices, wherein at least one of the signal sensing devices is configured to sense, at one or more output receptacles of the same particular power distribution component, one or more output signals resulting, at least in part, from the initial propagation of at least one of the input signals upstream through the plurality of power distribution components and the subsequent propagation of the at least one of the input signals downstream through the plurality of power distribution components, and cumulative alteration of the input signal via successive propagation through each of the plurality of power distribution components; and wherein the power distribution assessment device is configured to assess at least one power distribution component in the power distribution system based on a comparison of the one or more output signals to a baseline signature associated with a particular alteration of the input signal via propagation through the at least one power distribution component, wherein the at least one power distribution component is upstream and separate from the particular power distribution component;

wherein the plurality of power distribution components comprises one or more of:

an electrical power transformer configured to transform utility power received at an upstream terminus of the electrical power distribution system, a switchgear apparatus configured to selectively distribute electrical power from a selected one of the transformer or an electrical generator; or an uninterruptible power supply configured to distribute uninterrupted electrical power in the event of a power failure upstream from the uninterruptible power supply.

21. The system of claim 20, wherein the system is configured to assess at least one component or condition in the power distribution system based on one or more of the output signals.

22. The system of claim 20, wherein the system is configured to:

compute, based at least in part on the sensed output signals, the one or more baseline signatures at one or more points in the power distribution system.

23. The system of claim 20, wherein at least one of the sensing devices is configured to monitor the power distribution system for changes in one or more of the signatures while the power distribution system is distributing power to electrical systems.

24. The system of claim 20, wherein the one or more signal sensing devices are configured to sense output signals at two or more points in the power distribution system.

25. The system of claim 20, wherein at least one of the signal sensing devices is configured to sense an output signal at sensing points at two or more different levels of the power distribution system.

26. The system of claim 20, wherein the system is configured to sense at least one output signal at a different level in the power distribution system than at least one of the injection points for at least one the input signals.

27. The system of claim 20, wherein at least one of the signal injection devices or the signal sensing devices is configured to couple in an output receptacle of a PDU.

28. The system of claim 20, wherein the system is configured to create and store a map comprising baseline signatures for two or more points in the power distribution system.

29. The system of claim 20, wherein the system is configurable to trace a failure in the power distribution system to a particular branch of the power distribution system.

30. The system of claim 20, wherein the system is configurable to trace a failure in the power distribution system to a particular leg of current in the power distribution system.

* * * * *